United States Patent
Stasko

(10) Patent No.: US 6,211,653 B1
(45) Date of Patent: Apr. 3, 2001

(54) METHOD AND APPARATUS FOR MEASURING THE STATE-OF-CHARGE OF A BATTERY

(75) Inventor: John Chrysostom Stasko, Detroit, MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/467,195

(22) Filed: Dec. 20, 1999

(51) Int. Cl.[7] .................. H02J 7/04; H02J 7/16; G01N 27/416
(52) U.S. Cl. ............. 320/149; 320/132; 320/166; 324/428
(58) Field of Search ............... 320/149, 132, 320/136, 166; 324/427, 428

(56) References Cited

U.S. PATENT DOCUMENTS

| | | |
|---|---|---|
| 3,895,284 | 7/1975 | Schweizer et al. . |
| 4,307,330 | 12/1981 | Belot . |
| 4,740,754 | 4/1988 | Finger . |
| 4,968,941 | 11/1990 | Rogers . |
| 5,144,218 | 9/1992 | Bosscha . |
| 5,372,898 | 12/1994 | Atwater et al. . |
| 5,444,378 | 8/1995 | Rogers . |
| 5,451,881 | 9/1995 | Finger . |
| 5,600,247 | 2/1997 | Matthews . |

Primary Examiner—Peter S. Wong
Assistant Examiner—Gregory J. Toatley, Jr.
(74) Attorney, Agent, or Firm—Mark S. Sparschu

(57) ABSTRACT

An apparatus 10 for measuring the state-of-charge of a battery 14. Apparatus 10 includes a shunt resistor 18, a pair of capacitors 64, 66, and a controller 20. Controller 20 selectively and alternatively measures the electrical charge of battery 14 with a first of capacitors 64, 66 while selectively discharging and calibrating the other capacitor 64, 66. In this manner, controller 20 continuously provides an accurate measurement of the "state-of-charge" of battery 14.

18 Claims, 1 Drawing Sheet

METHOD AND APPARATUS FOR MEASURING THE STATE-OF-CHARGE OF A BATTERY

(1). FIELD OF THE INVENTION

This invention relates to a method and to an apparatus for measuring the state-of-charge of a battery and more particularly, to a method and to an apparatus for accurately measuring the state-of-charge of a vehicle battery.

(2). BACKGROUND OF THE INVENTION

Batteries are used in many assemblies, such as in vehicles, to provide electrical power to the various components and/or devices which cooperatively and respectively form these assemblies. It is highly desirable to accurately and continually measure and/or ascertain the electrical charge remaining within the battery, commonly referred to as the "state-of-charge", in order to ensure that the battery is timely and efficiently recharged or replaced, and to further ensure continued and substantially uninterrupted operation of the vehicle or other type of "battery powered" assembly. Consequently, many devices have been developed and have been used to selectively measure the state-of-charge of a battery and to selectively display the measured state-of-charge to a user of the battery powered assembly.

These prior state-of-charge measuring devices typically include an electrical current integrator (e.g., a capacitor) which is connected to the battery in an "electrical series" arrangement or manner, and which operatively integrates the electrical current which is provided by the battery. Particularly, this electrical current is coupled to and made to traverse the device. The device, in this manner, calculates the amount of electrical charge which has passed into the device due to the received electrical current. Particularly, this calculation is accomplished by measuring the voltage and/or the charge of the capacitor (i.e., the integral of the electrical current which has been received by the device during a certain time interval is substantially equal to the electrical charge which is accumulated upon and/or by the contained capacitor during this time interval). Similarly, this device measures the amount of electrical charge which is provided to the battery and the summation of these charges (i.e., the charges respectively provided by and provided to the battery) provides an accurate indication of the current state-of-charge of the battery.

As noted, many of these prior devices perform these calculations by measuring the voltage which is applied to and/or which is received by the capacitor from the battery, after a certain interval of time has elapsed, by the use of the equation: $Q=V*C$, where "Q" equals the amount of electrical charge accumulated by the capacitor or the integral of the electrical current which passes into the capacitor during the interval of time, "V" equals the voltage across the capacitor at the end of the interval of time, and "C" equals the capacitance value of the capacitor. In order for the foregoing calculation to be accurate, there must be substantially no voltage across the capacitor at the beginning of each measured time interval. Moreover, these calculations and/or measurements should be initiated as soon as the fully charged battery is operatively placed into the assembly.

These prior devices typically "conduct" or make these measurements over consecutive intervals of time and add these measurements together to determine the total electrical charge which has passed into and/or out of the battery. That is, by subtracting the total electrical charge which has passed out of the battery from the battery's total electrical charge capacity and then by adding the total electrical charge which has passed into the battery, a relatively accurate and current estimate of the battery's remaining charge is provided. A "running total" of the electrical charge remaining in the battery or the battery's "state-of-charge" is typically stored within the memory of these devices and is selectively displayed to a user of the vehicle or other battery powered device. While these state-of-charge measuring devices do effectively maintain and display the state-of-charge of a battery, they suffer from some drawbacks which undesirably reduce their respective accuracy.

For example and without limitation, while the capacitors employed by these prior devices effectively and respectively integrate the electrical current flowing into and/or out of the battery over a discrete interval of time, the capacitors eventually reach their respective charge storing capacity limit and must be "reset" or electrically discharged before continuing to integrate or further accumulate any more electrical charge. Discharging these capacitors requires some finite period of time, which is usually dependent upon the size of the capacitor.

While these capacitors are being discharged, the battery continues to operate (i.e., continues to provide and/or receive electrical current) and the concomitant change in the state-of-charge of the battery is not detected or measured by these devices (i.e., these devices are inoperable). Thus, this "unmeasured electrical current" is not factored into the "running total" kept by these devices, thereby causing these devices to produce inaccurate and/or erroneous "state-of-charge" estimates.

Attempts have been made to mathematically estimate the "unmeasured electrical current" using conventional mathematical extrapolation techniques. While these extrapolation techniques have been shown to somewhat reduce the overall error, they are not highly accurate and often result in the creation of relatively small errors which accumulate over time, causing the creation of relatively large undesirable state-of-charge measurement errors. These techniques further add undesirable complexity to these prior state-of-charge devices.

Additionally, the capacitance values of these capacitors often drift or vary over time. Any uncompensated variance in these capacitance values will cause these prior devices to further provide inaccurate state-of-charge measurements. In order to correct for these variances, efforts have been made to calibrate these devices and/or to measure the value of these capacitors at regular and/or discrete intervals of time, and to thereafter selectively compensate for the measured variances. However, while these devices are being calibrated, no measurement is made of the electrical current flowing into and out of the battery, thereby further increasing the state-of-charge measurement error.

There is therefore a need for a new and improved state-of-charge measuring device which provides a relatively accurate measure or estimate of the state-of-charge of a battery; which continuously measures or integrates the electrical current passing into or out of a battery; and which continues to integrate and/or measure electrical current while the device is being reset, discharged, and/or calibrated.

SUMMARY OF THE INVENTION

It is a first object of the invention to provide a method and an apparatus for accurately measuring the state-of-charge of a battery and which overcomes some or all of the previously delineated drawbacks associated with prior battery state-of-charge measuring devices.

It is a second object of the invention to provide a method and an apparatus for measuring the state-of-charge of a vehicle battery which has improved accuracy over other prior vehicle battery state-of-charge devices.

It is a third object of the invention to provide a method and an apparatus for measuring the state-of-charge of a battery which selectively and continuously measures the amount of charge flowing into and out of the battery.

It is a fourth object of the present invention to provide a method and an apparatus for measuring the state-of-charge of a battery which is substantially and automatically self-calibrating.

According to a second aspect of the present invention an apparatus for use in combination with a battery having an electrical charge is provided. The apparatus includes a first portion which is selectively coupled to the battery for a first period of time and which measures the electrical charge of the battery during the first period of time; a second portion which is selectively coupled to the battery for a second period of time and which measures the electrical charge of the battery during the second period of time; and a third portion which is selectively coupled to the first portion during the second period of time and to the second portion during the first period of time and which calibrates the first portion during the second portion of time and which calibrates the second portion during said first period of time, thereby allowing the first portion and the second portion to cooperatively provide an accurate measurement of the amount of charge of said battery.

According to a first aspect of the present invention an apparatus for use in combination with a battery having an electrical charge is provided. The apparatus includes a first portion having a first capacitor which is used to measure the charge of the battery during a first period of time; a second portion having a second capacitor which is used to measure the charge of the battery during the second period of time; and a third portion which is selectively coupled to the first portion during the second period of time and to the second portion during the first period of time and which discharges the first capacitor during the second period of time and which discharges the second capacitor during said first period of time, thereby allowing the first portion and the second portions to cooperatively provide an accurate measurement of the amount of charge.

According to a third aspect of the present invention a method for determining the amount of electrical charge remaining within a battery having a certain electrical charge capacity and producing a first electrical current which provides a first amount of electrical charge, is provided. The method includes the steps of providing a first and a second selectively dischargable current integrator; providing a first and a second electrical current generator which respectively generates a first and a second electrical current; communicating the first electrical current to the first integrator for a first time interval, thereby producing a first voltage; communicating the second electrical current to the second integrator for a second time interval, thereby producing a second voltage; using the first and second voltages to determine the amount of electrical charge remaining within the battery.

These and other features, advantages, and objects of the invention will become apparent by reference to the following specification and by reference to the following drawings.

DETAILED DESCRIPTION OF THE PREFERRED EMBODIMENT OF THE INVENTION

Figure 1:
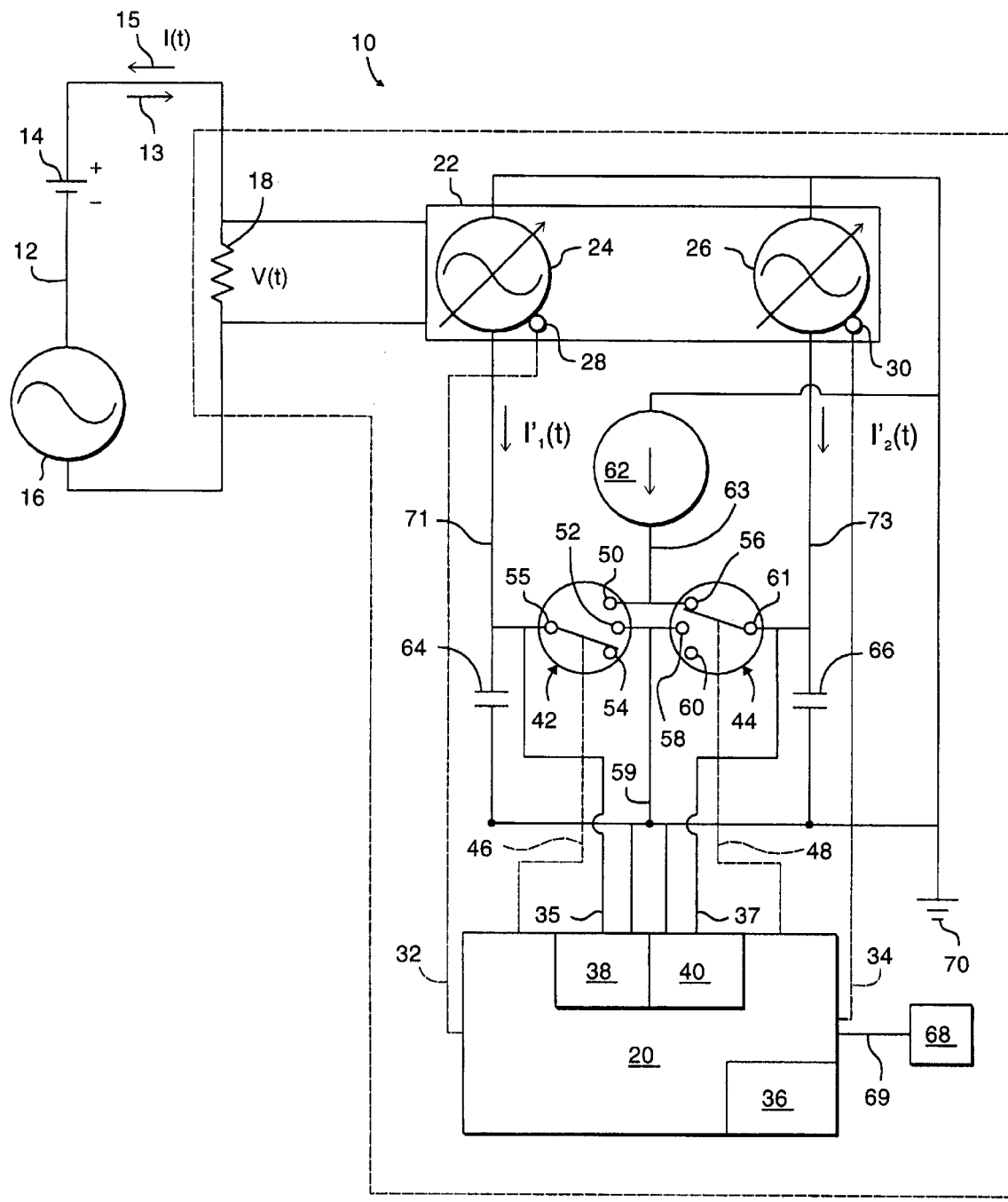
FIG. 1 is a block diagram of an apparatus for measuring the state-of-charge of a battery which is made in accordance with the teachings of the preferred embodiment of the invention.

Referring now to FIG. 1, there is shown an apparatus 10 for measuring the state-of-charge of a battery and which is made in accordance with the teachings of the preferred embodiment of the invention. Particularly, apparatus 10 is connected in "electrical series" with a conventional and/or typical storage cell or battery 14 and to a variable current load 16. Battery 14, variable current load 16 and apparatus 10 therefore, as shown cooperatively form an "electrical series type" circuit 12.

In the preferred embodiment of the invention, variable load 16 includes and functionally represents both electrical discharging/depleting components (e.g., components which remove electrical current or electrical charge from battery 14), such as an electric motor, electric lights, and/or heating elements, as well as electrical recharging/supplying components (e.g., components which replace or transfer electrical current or electrical charge into battery 14), such as an alternator and/or battery charger. Hence, the electrical current which selectively travels through circuit 12, denoted as "I(t)", flows in the direction 13 (e.g., into the battery 14) or in the direction 15 (e.g., out of battery 14). In one non-limiting example, battery 14 comprises and/or represents the battery of an electric vehicle and variable load 16 comprises and/or represents the electrical components of a conventional and/or commercially available vehicle (e.g., an electric vehicle) which are physically and electrically connected to battery 14 and which selectively remove electrical charge from or which selectively provide electrical charge to battery 14.

Apparatus 10 includes a conventional sensing or "shunt" resistor 18 having a relatively small resistance value and which is connected in "electrical series" with battery 14 and load 16. By continually and/or systematically measuring the varying voltage "across" resistor 18, apparatus 10 calculates the amount or the value of the electrical charge passing into and/or out of battery 14. As described more fully and completely below, apparatus 10 aggregates (e.g., keeps a running total of) these calculated values and uses this aggregation to derive and/or to substantially and accurately ascertain the state-of-charge of the battery 14. That is, by dynamically and/or automatically subtracting this total value of the electrical charge expelled by battery 14 from the total charge capacity of battery 14, and adding the total value of the electrical charge which has been provided to the battery 14, apparatus 10 determines the amount of the electrical charge remaining within battery 14 or the "current state-of-charge" of the battery 14.

Apparatus 10 includes a variable voltage sensing and current generating assembly or portion 22, which is physically connected in a electrical "parallel manner" to resistor 18. Assembly or device 22 includes two substantially identical and conventional gated variable current sources 24, 26. Device 22 is adapted to sense the voltage across resistor 18, (e.g., denoted as "V(t)"), and to selectively cause each of current sources 24, 26 to generate electrical currents, respectively denoted as "I'$_1$(t)" and "I'$_2$(t)", which are each proportional to the voltage, "V(t)", "across" resistor 18. The electrical currents generated by sources 24, 26, are respectively represented by the following equations: I'$_1$(t)=kV(t) when gate 28 is "true" or open; I'$_1$(t)=0 when gate 28 is "false" or closed, I'$_2$(t)=kV(t) when gate 30 is "true" or open; and I'$_2$(t)=0 when gate 30 is "false" or closed, where "k" is equal to a proportionality constant and where "t" denotes an instant of measured time.

Apparatus 10 further includes a conventional and/or commercially available microprocessor, microcontroller, or controller 20 operating under stored program control. Controller 20 includes a conventional memory unit or portion 36 and two conventional and commercially available analog-to-digital conversion devices 38, 40, which are adapted to selectively receive and to digitally convert an analog voltage signal or to "digitize" the value of the received and measured analog voltage (i.e., convert the measured analog voltage to a digital value). The program defining the operations of controller 20 is selectively stored within memory 36.

Controller 20 is respectively, physically, electrically and operatively coupled to gates 28, 30 by use of control lines or busses 32, 34. Controller 20 is further physically, electrically, and operatively coupled, to switches 42, 44, which comprise conventional and commercially available electronic or electromechanical switching devices (e.g., transistors or relays), by respective use of control lines or busses 46, 48. In other alternate embodiments, switches 42, 44 may comprise a single switching device or chip. Switches 42 and 44, operating under control of controller 20, have respective terminals 55, 61 which are respectively and selectively coupled to a selected one of the terminals 50, 52, 54 and to a selected one of the terminals 56, 58, 60. Terminals 50, 56 are each physically and electrically coupled to a conventional and constant or "calibrated" current source 62 by use of bus 63; terminals 52, 58 are each physically and electrically coupled to electrical ground portion 70 by use of bus 59; and terminals 54, 60 are electrically "open" or unconnected terminals.

Controller 20 is further coupled, by bus 69, to a display 68 comprising, a conventional and commercially available output display device, such as and without limitation a flat panel display, a liquid crystal display, an analog gauge display, a video display, or substantially any other type of display which is suitable to display output data and/or information which is generated by system 10. In the one non-limiting embodiment, display 68 is mounted within the passenger compartment of a vehicle, such as on or within the vehicle dashboard or instrument panel (not shown).

A pair of conventional electrical current integrators or capacitors 64, 66 which, in the preferred embodiment of the invention, comprise substantially identical, conventional, and commercially available capacitors, are each physically, electrically, and respectively connected to terminals 55, 61 of switches 42, 44 and to gated variable current sources 24, 26 by respective busses 71, 73, to analog-to-digital converters 38, 40, by respective busses 35, 37, and to the electrical ground or the electrical "zero" potential 70.

In operation, apparatus 10 measures the voltage "over" or "across" resistor 18 (e.g., denoted as "V(t)"). This voltage is substantially equal to the value of the current "I(t)" multiplied by the value of "$R_s$", where "$R_s$" represents and/or denotes the electrical resistance value of resistor 18. Further, after device 22 senses or measures the voltage "V(t)", the device 22 selectively generates the previously described currents "$I'_1(t)$" and/or "$I'_2(t)$" by use of the electrical current sources 24, 26 in the following manner.

Particularly, during an initial or first measurement cycle, controller 20 selectively "opens" gate 28 by placing an electrical signal onto bus 32 and substantially and simultaneously "toggles" or places switch 42 in a "measure position" by coupling terminal 55 to terminal 54. In this manner, capacitor 64 receives the current "$I'_1(t)$" by or through bus 71. Controller 20 "integrates" the received electrical current, thereby providing a relatively accurate measurement of the amount of electrical charge that is being received by capacitor 64. Specifically, the following equations are used by the controller 20 to calculate the amount of electrical charge which is received by capacitor 64:

$$V_1 = \frac{1}{C_1} \int I'_1(t)dt, \quad \text{(Equation 1)}$$

where "$V_1$" denotes the voltage which is created "over" and/or "across" capacitor 64 by the received electrical current, "$C_1$" denotes the value or capacitance of capacitor 64, and $I'_1(t)$ denotes the electrical current flowing from source 24 into the capacitor 64; and $$Q_1 = \int I'_1(t)dt, \quad \text{(Equation 2)}$$

where "$Q_1$" denotes the amount of electrical charge received by capacitor 64 during an interval of time (i.e., integrating "$I'_1(t)dt$" provides the amount of electrical charge received by the capacitor 64 during the interval of time for which the integral is evaluated). Substituting and solving for the value "$\int I'_1(t)dt$" or "$Q_1$", yields the equation $$Q_1 = V_1 * C_1. \quad \text{(Equation 3)}$$

Utilizing this third equation, controller 20 determines this amount of electrical charge, "$Q_1$", received by the capacitor 64 "Q" by measuring the voltage "over" and/or "across" the capacitor 64, "$V_1$", after a certain or predetermined interval of time has elapsed (the initial voltage over capacitor 64 is assumed to be zero in this non-limiting example) and multiplying that voltage by the value of "$C_1$".

Specifically, in the preferred embodiment of the invention, after a predetermined period of time has elapsed, (e.g., the end of the first measurement cycle), controller 20 "closes" gate 28 and simultaneously and operatively activates portion 38 which measures the voltage, "$V_1$", "over" and/or "across" capacitor 66. Device 38 then digitizes the measured voltage, "$V_1$" (i.e., converts voltage "$V_1$" to a digital number), and stores this value within memory 36. In the preferred embodiment, the digitized voltage value is further multiplied by the digitized value of "$C_1$", and the resulting value, equaling the amount of charge received by capacitor 64 during the measured interval of time (i.e., $Q_1 = V_1 * C_1$), is stored within the non-volatile memory 36 of controller 20.

As controller 20 "closes" gate 28 to perform the aforedescribed measurement, controller 20, by use of control bus or line 34, substantially and simultaneously "opens" gate 30 and "toggles" switch 44 to a measure position by connecting terminal 61 to terminal 60 (i.e., the "measure" position), thereby allowing apparatus 10 to continue to measure substantially all of the electrical current flowing through resistor 18 and which is provided to or provided by battery 16, without delay or interruption. Specifically, by "opening" gate 30, source 26 generates current "$I'_2(t)$," which is received and which is "integrated" by capacitor 66, according to the above-described procedure. Device 40 digitizes the voltage upon capacitor 66, "$V_2$" and the resulting "digitized" capacitor voltage "$V_2$" is multiplied by the value of "$C_2$" to determine and/or to estimate the amount of accumulated charge "$Q_2$" (i.e., $V_2 * C_2$) over the interval of time that gate 30 is "open". This charge "$Q_2$" is added to the previously stored or measured charge value "$Q_1$", thereby providing a measurement of the total amount of charge, "$Q_{total}$," that has been received by capacitors 64, 66 (e.g., $Q_{total} = Q_1 + Q_2$) during these two measurement cycles.

While capacitor 66 "integrates" current "$I'_2(t)$", apparatus 10 discharges and calibrates capacitor 64. More particularly, as gate 28 is "closed" (and gate 30 is "opened"), controller 20 substantially and simultaneously "toggles" or moves switch 42 to terminal 52, by use of bus 46, thereby connecting capacitor 64 to electrical ground 70 and causing capacitor 64 to begin to electrically discharge. After a predetermined period of time has elapsed and capacitor 64 is substantially and completely discharged (e.g., after about one millisecond), controller 20, by use of control line or bus 46, "toggles" or moves switch 42 to terminal 50, thereby connecting capacitor 64 to the constant calibrated current source 62.

Current source 62 provides a known or constant electrical current to capacitor 64 over a predetermined period of time. After the predetermined period of time has expired, device 38 measures the voltage "over" or "across" capacitor 64, as previously described. Controller 20 mathematically "solves for" the current capacitance value, "$C_1$," of capacitor 64 by use of the equation $$V_{cal} = \frac{1}{C_1} \int I'_{cal}(t)dt, \quad \text{(Equation 4)}$$

where "$V_{cal}$" is the measured voltage "over" and/or "across" capacitor 64 and where "$I_{cal}(t)$" is the known calibration current emanating from source 62.

This current or dynamically measured capacitance value, "$C_1$," is then used by controller 20 in the subsequent measurement of charge "$Q_1$". In this manner, it should be appreciated that apparatus 10 automatically adjusts and/or corrects for any "drift" or variance in the capacitance value of capacitor 64 between each measurement cycle in which capacitor 64 is used to provide a charge measure. After the calibration measurement is made, controller 20 "toggles" or moves terminal 43 to terminal 52, thereby connecting capacitor 64 to ground and effective to selectively and electrically discharge capacitor 64.

Capacitor 64 remains discharged or electrically "grounded" until the capacitor 66 has been fully and desirably charged. Controller 20 then substantially and simultaneously "closes" gate 30 while "opening" gate 28; and substantially and simultaneously connects terminal 55 to "measurement" terminal 54 while connecting terminal 61 to "discharge" terminal 58. Capacitor 64 and device 38 again "integrate" the generated current "$I'_1(t)$" in the previously described manner, thereby calculating a second "$Q_1$" value which is stored within memory 36 and which is added to the value of "$Q_{total}$". As the charge "$Q_1$" is measured and/or calculated, capacitor 66 is initially electrically discharged, "calibrated" and again electrically discharged in a substantially identical manner and sequence, as previously described for capacitor 64. Once the second "$Q_1$" measurement is complete, controller 20 selectively measures and/or calculates a second "$Q_2$" measurement, while discharging, calibrating, and discharging capacitor 64 in the same previously described manner and sequence. Apparatus 10 continues to "cycle" or repeat these procedures in this manner, thereby continually accumulating or summing the integrated electrical currents or charge values "$Q_1$", "$Q_2$" over sequential intervals of time. In this manner, apparatus 10 dynamically creates and maintains a substantially accurate total value of the electrical charge "$Q_{total}$" passing through capacitors 64, 66 (i.e., $Q_{total}=Q_1+Q_2+Q_1+Q_2+\ldots$). It should be appreciated that the "sign" (i.e., positive and negative) and value of the "$Q_1$ and "$Q_2$" measurements will vary depending on the direction and magnitude of current "I(t)" (e.g., charges entering the battery 14 will have a "negative" magnitude and those leaving the battery 14 will have a "positive" magnitude).

The total value of the electrical charge passing through capacitors 64, 66, during any one period of time or "cycle" in which a pair of "$Q_1$" and "$Q_2$" measurements are made (i.e., $Q_1+Q_2$) is related to the total charge "Q" passing in and/or out of battery 14 during that same interval of time or "cycle". Controller 20 utilizes the following equations to determine this charge for any one such "cycle":

$$Q = \int I(t)dt \quad \text{(Equation 5)};$$

$$I(t) = V(t)/R_s \quad \text{(Equation 6)};$$

and $$V(t) = I'_1(t)/k + I'_2(t)/k \quad \text{(Equation 7)}.$$

Substituting and solving for the value "Q" yields:

$$Q = \frac{1}{R_s k}\left(\int I'_1(t)dt + \int I'_2(t)dt\right) \text{ or} \quad \text{(Equation 8)}$$

$$Q = \frac{Q_1 + Q_2}{R_s k}. \quad \text{(Equation 9)}$$

Controller 20 utilizes the above-described relationships to keep a "running total" or "tally" of the amount of charge, "Q(t)", which has passed out of or into battery 14 over time. Particularly, the value of "Q(t)" (e.g., the total amount of the charge which has been provided by and/or to the battery) is equal to the total amount of measured charge "$Q_{total}$" (i.e., $Q_1+Q_2+Q_1+Q_2+\ldots$) divided by the quantity "$R_s k$".

As the value of "$Q_{total}$" is accumulated or changes, the total electrical charge flowing out of or into battery 14, "Q(t)" is simultaneously calculated and accumulated by controller 20 in the foregoing manner. Particularly, controller 20 maintains and selectively updates the value "Q(t)", representing the "running total" of the amount of charge which has passed out of battery 14 (e.g., having a positive value) or has passed into battery 14 (e.g., having a negative value). By subtracting the current value of Q(t) from the total charge capacity of battery 14, controller 20 dynamically determines the current state-of-charge of battery 14 or the charge remaining in battery 14. Controller 20 continuously and selectively outputs this current "state-of-charge" value to display 68, so that a user of apparatus 10 has a continuous and current display of the electrical charge remaining within battery 14.

It should be understood that the inventions described herein are provided by way of example only and that numerous changes, alterations, modifications, and substitutions may be made without departing from the spirit and scope of the inventions as delineated within the following claims.

What is claimed is:

1. An apparatus for use in combination with a battery having an electrical charge, said apparatus comprising:

a first portion which is selectively coupled to said battery for a first period of time, which measures said electrical charge of said battery during said first period of time, and which is selectively and electrically dischargeable;

a second portion which is selectively coupled to said battery for a second period of time, which measures said electrical charge of said battery during said second period of time, and which is selectively and electrically dischargeable;

a third portion which is selectively coupled to said first portion during said second period of time and to said second portion during said first period of time and which electrically discharges said first portion during said second period of time and which electrically discharges said second portion during said first period of time, thereby allowing said first portion and said second portions to cooperatively provide a measurement of said electrical charge of said battery.

2. The apparatus of claim 1 wherein said third portion calibrates said first portion during said second period of time and wherein said third portion calibrates said second portion during said first period of time, thereby increasing the accuracy of said measured amount of said electrical charge of said battery.

3. The apparatus of claim 1 further comprising a display which selectively displays said measurement of said electrical charge of said battery.

4. The apparatus of claim 1 wherein said first and said second portions each comprise an electrical current integrator.

5. The apparatus of claim 4 wherein said first and said second portions each comprise a substantially identical capacitor.

6. The apparatus of claim 5 wherein said first and said second portions each further comprise a substantially identical electrical current source.

7. The apparatus of claim 6 wherein said first portion includes a switch which selectively couples one of said electrical current sources to said respective capacitor.

8. The apparatus of claim 7 wherein said first and said second portions are substantially identical.

9. An apparatus for measuring the electrical charge of a battery of the type which selectively provides an electrical current, said apparatus comprising:

a first current source which selectively generates a first current which is proportional to said electrical current;

a second current source which selectively generates a second current which is proportional to said electrical current;

a first capacitor of the type which receives electrical current and which produces a certain first voltage, said first capacitor being selectively coupled to said first current source;

a second capacitor of the type which receives electrical current and which produces a certain second voltage, said second capacitor being selectively coupled to said second current source;

a switch which is coupled to electrical ground and to said first and to said second capacitors; and a controller which is communicatively coupled to said first and to said second current sources, to said first and to said second capacitor, and to said switch, said controller selectively causing said first current source to generate said first current and to communicate said first current to said first capacitor, thereby producing said first voltage, said controller further causing said switch to connect said second capacitor to said electrical ground as said first current is communicated to said first capacitor, thereby electrically discharging said second capacitor, said controller further measuring said first voltage and using said measured first voltage to estimate said charge of said battery.

10. The apparatus of claim 9 further comprising a calibrated current source which selectively produces an electrical current of a known value and which is coupled to said switch.

11. The apparatus of claim 10 wherein said controller further causes said switch to connect said second capacitor to said calibrated current source as said first voltage is produced.

12. A method for determining the amount of charge remaining within a battery, said method comprising the steps of:

providing first and second selectively and electrically dischargeable current integrators;

providing first and second current generators which respectively and selectively generate a first and a second electrical current;

communicating said first electrical current to said first current integrator for a first interval of time, thereby producing a first voltage;

communicating said second current to said second current integrator for a second interval of time, thereby producing a second voltage;

selectively discharging said first current integrator during said second interval of time;

selectively discharging said second current integrator during said first interval of time; and using said first and second voltages to determine the amount of charge remaining within said battery.

13. The method of claim 12 further comprising the steps of:

providing a display; and selectively displaying the amount of charge remaining within said battery upon said display.

14. The method of claim 13 wherein said first integrator comprising a capacitor.

15. The method of claim 13 wherein said second integrator comprising a capacitor.

16. The method of claim 11 further comprising the steps of:

calibrating said first integrator; and calibrating said second integrator.

17. The method of claim 13 wherein said first integrator is calibrated during said second interval of time.

18. The method of claim 17 wherein said second integrator is calibrated during said first interval of time.

* * * * *